(12) United States Patent
Eken et al.

(10) Patent No.: US 8,461,923 B2
(45) Date of Patent: Jun. 11, 2013

(54) LOGARITHMIC MEAN-SQUARE POWER DETECTOR WITH SERVO CONTROL LOOP

(75) Inventors: Yalcin A. Eken, Istanbul (TR); Savas Tokmak, Istanbul (TR)

(73) Assignee: Hittite Microwave Norway AS, Tiller (NO)

( * ) Notice: Subject to any disclaimer, the term of this patent is extended or adjusted under 35 U.S.C. 154(b) by 111 days.

(21) Appl. No.: 12/951,697

(22) Filed: Nov. 22, 2010

(65) Prior Publication Data

US 2011/0121896 A1  May 26, 2011

Related U.S. Application Data

(60) Provisional application No. 61/263,684, filed on Nov. 23, 2009.

(51) Int. Cl.
*H03G 3/20* (2006.01)

(52) U.S. Cl.
USPC .......................... 330/140; 330/279

(58) Field of Classification Search
USPC ................... 330/140, 279, 350; 327/348, 349
See application file for complete search history.

(56) References Cited

U.S. PATENT DOCUMENTS

| | | |
|---|---|---|
| 3,517,216 A | 6/1970 | Cope |
| 3,992,584 A | 11/1976 | Dugan |
| 4,047,235 A | 9/1977 | Davis |
| 4,156,848 A | 5/1979 | Stimple et al. |
| 4,758,793 A | 7/1988 | Sheade et al. |
| 4,873,484 A | 10/1989 | Adam |
| 4,990,803 A | 2/1991 | Gilbert |
| 5,077,541 A | 12/1991 | Gilbert |
| 5,126,686 A | 6/1992 | Tam |
| 5,268,601 A | 12/1993 | Cossins |
| 5,274,582 A | 12/1993 | Whitby |
| 5,298,811 A | 3/1994 | Gilbert |
| 5,338,985 A | 8/1994 | Fotowat-Ahmady et al. |
| 5,402,451 A | 3/1995 | Kaewell, Jr. et al. |

(Continued)

FOREIGN PATENT DOCUMENTS

EP   2020760 A2   2/2009

OTHER PUBLICATIONS

Counts, et al., "Second-Generation Monolithic RMS-To-DC Converter," analog dialogue, vol. 18, No. 1, pp. 11-13 (1984).
Counts, et al., "Monolithic IC RMS-To-DC Converter," analog dialogue, vol. 11, No. 2, pp. 3 and 4 (1977).
Counts, "True RMS Measurement Using the AD531," analog dialogue, vol. 7, No. 1, p. 13 (1972).

(Continued)

*Primary Examiner* — Patricia Nguyen
(74) *Attorney, Agent, or Firm* — Rajesh Vallabh; Foley Hoag LLP

(57) ABSTRACT

A variable gain amplifier includes a plurality of amplification elements arranged to generate amplified representations of an RF input signal at a plurality of nodes. A plurality of controllable response elements each have an input coupled to a different one of the nodes to receive a different one of the amplified representations of the RF input signal. A scale factor generator is coupled to each of the controllable response elements. The scale factor generator receives a gain control signal and generates scale factor signals for varying the response of each of the controllable response elements such that as the scale factor generator sweeps through a full range of the gain control signal, the response of each of the controllable response elements is, in succession, increased smoothly to a peak and thereafter decreased smoothly to a lower level to produce a scaled output. A summing element is coupled to the controllable response elements for combining the scaled outputs of the controllable response elements to generate an output of the variable gain amplifier having a given gain range.

59 Claims, 11 Drawing Sheets

U.S. PATENT DOCUMENTS

| | | | |
|---|---|---|---|
| 5,432,478 | A | 7/1995 | Gilbert |
| 5,450,029 | A | 9/1995 | Jacobs et al. |
| 5,473,244 | A | 12/1995 | Libove et al. |
| 5,608,409 | A | 3/1997 | Rilling |
| 5,684,431 | A | 11/1997 | Gilbert et al. |
| 5,724,003 | A | 3/1998 | Jensen et al. |
| 5,790,943 | A | 8/1998 | Fotowat-Ahmady et al. |
| 6,098,463 | A | 8/2000 | Goldberg |
| 6,291,984 | B1 | 9/2001 | Wong et al. |
| 6,437,630 | B1 | 8/2002 | Gilbert |
| 2002/0044018 | A1 | 4/2002 | Dupuis et al. |
| 2008/0278237 | A1 | 11/2008 | Blin |

OTHER PUBLICATIONS

Gilbert, "Current-mode Circuits From a Translinear Viewpoint a Tutorial," Chap. 2, pp. 11-91, (1990).

Gilbert, "Translinear Circuits An Historical Overview," Analog Integrated Circuits and Signal Processing, 9, 95-118 (1996).

Kitchin, et al., "Low-Cost True-MRS Chips Also Compute AC Average," analog dialogue, vol. 22, No. 1, pp. 8 and 9 (1988).

Nash, et al., "Revolutionary RF IC Performs RMS-to-DC Conversion," Microwaves & RF, pp. 140-146 (1999).

International Search Report and Written Opinion for PCT/US2010/057616 dated Jul. 28, 2011.

LOGARITHMIC MEAN-SQUARE POWER DETECTOR WITH SERVO CONTROL LOOP

CROSS REFERENCE TO RELATED APPLICATION

This application claims priority from U.S. Provisional Patent Application Ser. No. 61/263,684, filed on Nov. 23, 2009, entitled Logarithmic Mean-Square Power Detector with Servo Control Loop, which is hereby incorporated by reference.

BACKGROUND

There are many applications in which it is desirable to measure the average power level of a radio frequency (RF) signal. For example, power measurement and control of RF signals in both the transmitting and receiving chains of modern wireless communications systems, such as cellular telephone networks, may be essential. To efficiently use the available bandwidth, the transmitted signals in these systems may be modulated using complex modulation schemes such as Code Division Multiple Access (CDMA), Wideband Code Division Multiple Access (WCDMA), or Worldwide Interoperability for Microwave Access (WiMAX). These complex modulated signals have a time varying crest factor, which is defined as the peak to average power ratio of the signal. Intolerable errors can result if conventional power detectors are used to measure the signal power of the modulated signals.

BRIEF SUMMARY OF DISCLOSURE

A variable gain amplifier in accordance with one or more embodiments includes a plurality of amplification elements arranged to generate amplified representations of an RF input signal at a plurality of nodes. A plurality of controllable response elements each have an input coupled to a different one of the nodes to receive a different one of the amplified representations of the RF input signal. A scale factor generator is coupled to each of the controllable response elements. The scale factor generator receives a gain control signal and generates scale factor signals for varying the response of each of the controllable response elements such that as the scale factor generator sweeps through a full range of the gain control signal, the response of each of the controllable response elements is, in succession, increased smoothly to a peak and thereafter decreased smoothly to a lower level to produce a scaled output. A summing element is coupled to the controllable response elements for combining the scaled outputs of the controllable response elements to generate an output of the variable gain amplifier having a given gain range.

A variable gain amplifier in accordance with one or more further embodiments includes a plurality of amplification elements arranged to generate amplified representations of an RF input signal at a plurality of nodes. The variable gain amplifier also includes a plurality of transconductance elements, each having an input coupled to a different one of the nodes to receive a different one of the amplified representations of the RF input signal. The transconductance elements convert voltage levels of the amplified representations of the RF input signal to current levels. The variable gain amplifier also includes a plurality of controllable selector elements, each having an input coupled to an output of a different one of the plurality of transconductance elements to receive the current levels of the amplified representations of the RF input signal. A scale factor generator is coupled to each of the controllable selector elements. The scale factor generator receives a gain control signal and generates scale factor signals for varying the response of each of the controllable selector elements such that as the scale factor generator sweeps through a full range of the gain control signal, the response of each of the controllable selector elements is, in succession, increased smoothly to a peak and thereafter decreased smoothly to a lower level to produce a scaled output. A summing element is coupled to the plurality of controllable selector elements for combining the scaled outputs of the plurality of controllable selector elements to generate an output of the variable gain amplifier having a given gain range.

A method of amplifying an RF input signal in accordance with one or more embodiments includes the steps of: (a) generating a plurality of amplified representations of the RF input signal; (b) variably scaling each of the amplified representations of the RF input signal based on a gain control signal by, in succession, increasing each of the amplified representations of the RF input signal smoothly to a peak and thereafter decreasing it smoothly to a lower level to produce a scaled output while sweeping through a full range of the gain control signal; and (c) combining the scaled outputs to generate an output having a given gain range.

A method of amplifying an RF input signal in accordance with one or more further embodiments includes the steps of: (a) generating a plurality of amplified representations of the RF input signal; (b) converting voltage levels of the amplified representations of the RF input signal to current levels; (c) variably scaling the current level of each of the amplified representations of the RF input signal based on a gain control signal by, in succession, increasing the current level smoothly to a peak and thereafter decreasing it smoothly to a lower level to produce a scaled output while sweeping through a full range of the gain control signal; and (c) combining the scaled outputs to generate an output having a given gain range.

A mean square power detector in accordance with one or more embodiments includes a variable gain amplifier, a squaring power detector, and an integrator. The variable gain amplifier includes a plurality of amplification elements arranged to generate amplified representations of an RF input signal at a plurality of nodes. A plurality of controllable response elements each has an input coupled to a different one of the plurality of nodes to receive a different one of the amplified representations of the RF input signal. The variable gain amplifier also includes a scale factor generator coupled to each of the controllable response elements. The scale factor generator receives a gain control signal and generates scale factor signals for varying the response of each of the controllable response elements such that as the scale factor generator sweeps through a full range of the gain control signal, the response of each of the controllable response elements is, in succession, increased smoothly to a peak and thereafter decreased smoothly to a lower level to produce a scaled output. A summing element is coupled to the controllable response elements for combining the scaled outputs of the controllable response elements to generate an output of the variable gain amplifier having a given gain range. The squaring power detector is coupled to the variable gain amplifier for producing a detected signal from the output of the variable gain amplifier. The integrator is coupled to the squaring power detector for integrating the difference between the detected signal received from the squaring power detector and a reference signal to provide a representation of the mean square or root mean square of the RF input signal.

A mean square power detector in accordance with one or more further embodiments includes a variable gain amplifier, a squaring power detector, and an integrator. The variable gain amplifier includes a plurality of amplification elements arranged to generate amplified representations of an RF input signal at a plurality of nodes. The variable gain amplifier also includes a plurality of transconductance elements each having an input coupled to a different one of the nodes to receive a different one of the amplified representations of the RF input signal. The transconductance elements convert voltage levels of the amplified representations of the RF input signal to current levels. The variable gain amplifier also includes a plurality of controllable selector elements, each having an input coupled to an output of a different one of the transconductance elements to receive the current levels of the amplified representations of the RF input signal. A scale factor generator is coupled to each of the controllable selector elements. The scale factor generator receives a gain control signal and generates scale factor signals for varying the response of each of the controllable selector elements such that as the scale factor generator sweeps through a full range of the gain control signal, the response of each of the controllable selector elements is, in succession, increased smoothly to a peak and thereafter decreased smoothly to a lower level to produce a scaled output. A summing element is coupled to the controllable selector elements for combining the scaled outputs of the controllable selector elements to generate an output of the variable gain amplifier having a given gain range. The squaring power detector produces a detected signal from the output of the variable gain amplifier. The integrator integrates the difference between the detected signal received from the squaring power detector and a reference signal to provide a representation of the mean square or root mean square of the RF input signal.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

BRIEF DESCRIPTION OF THE DRAWINGS

Like reference numbers denote generally like parts in the drawings.

DETAILED DESCRIPTION

Various embodiments of the present invention are directed to detector circuits that accept a modulated or un-modulated RF input signal and provide an output that varies as a quasi-linear function of the logarithm of the mean of the square of the RF input signal voltage. The detector circuits provide an output that varies generally linearly in dB with the mean square (MS) voltage of the RF signal. The circuits can provide a wide dynamic range of power detection for input signals with improved output linearity.

Figure 1:
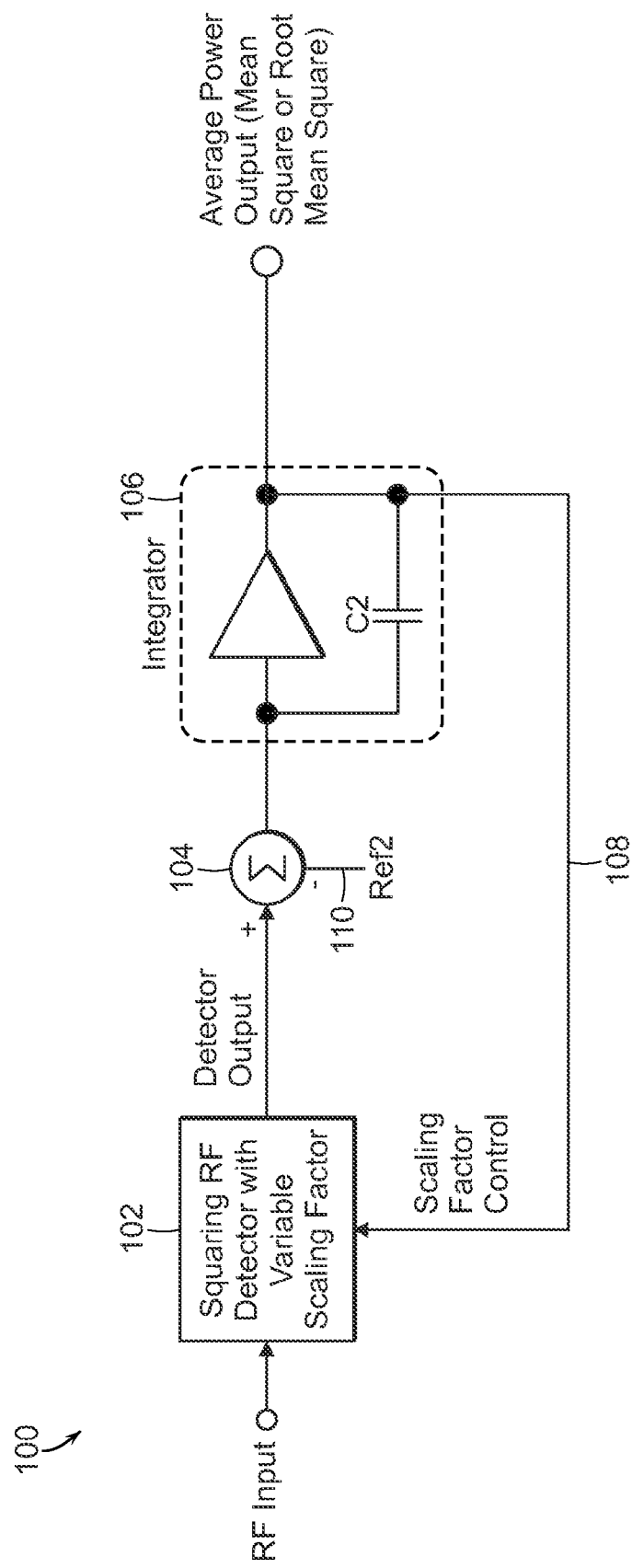
FIG. 1 is a block diagram illustrating a mean square power detector.

FIG. 1 is a block diagram illustrating a mean square detector (MSD) 100 that includes a rectifying (i.e., squaring) power detector 102 with a squaring range for detecting the input signal level, an analog comparator (i.e., subtractor) 104 for comparing the detected signal level with a reference level 110, and an integrator 106 with internal or external capacitors for averaging the detected signal level to generate the mean square output. The MSD 100 also includes a servo feedback loop 108, which is formed by connecting the output of the integrator 106 to a scale-control input of the squaring detector 102. The high gain of the integrator 106 keeps the average of the output of the squaring detector 102 (which is the mean square of the input signal) equal or approximately equal to the reference input 110 by adjusting the scaling input of the squaring detector 102, resulting in a servo control loop. In the servo-loop, the scaling factor decreases (assuming that the squaring detector output increases with increasing scaling factor) if the RF input power increases, keeping the average output of the squaring detector approximately at a constant value. Similarly, the scaling factor should increase for decreasing input power. The servo control loop 108 thereby forces the squaring detector 102 to operate at a controlled output operating point.

Figure 2:
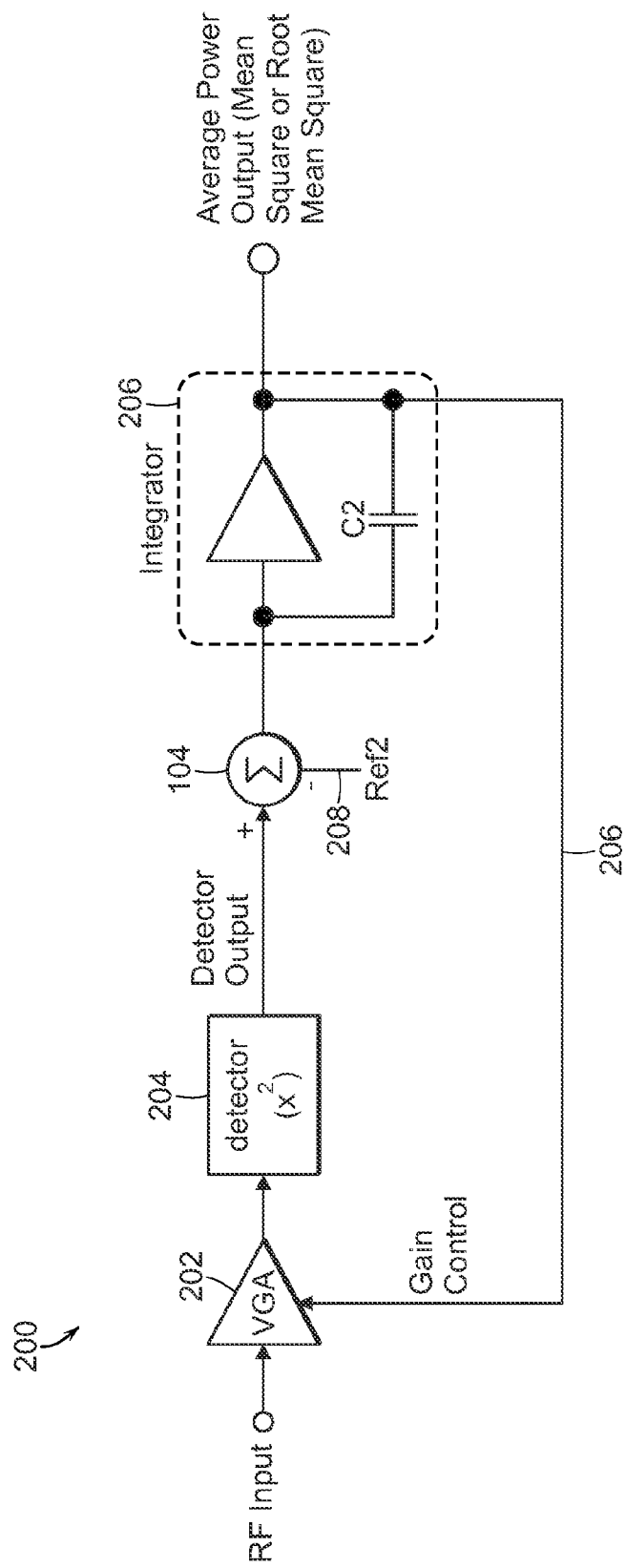
FIG. 2 is a block diagram illustrating a mean square power detector.

FIG. 2 is a block diagram illustrating a mean square power detector 200. The MS power detector 200 uses a variable gain amplifier (VGA) 202 and a constant scale factor squaring power detector 204 (instead of the squaring power detector 102 with variable scaling factor shown in FIG. 1). In this embodiment, the RF input signal is fed to the VGA 202 and a feedback signal from the output of the integrator 206 is used to control the gain of the VGA 202 through a feedback loop 206. By sweeping through the gain range of the VGA 202 by adjusting the feedback signal, representation of the RF input signal may be obtained at sequentially varying levels of gain. The output of VGA 202 drives the squaring power detector 204. Because of the servo feedback loop 206, the average value of the detector output is driven to approximately match the reference signal 208, and therefore, the MS power detector 200 may reach a steady state when the system output signal (which is the average power output signal output by the integrator 206) selects a gain level of the VGA 202 that results in the detector output signal being approximately equal to the reference signal 208.

Various control characteristics, linear or nonlinear, can be selected for the VGA 202 to obtain different transfer functions between the system RF input signal and detected output voltage (representing the mean square or root mean square power of the input signal). For example, if the VGA has exponential gain control, the mean square detector system may provide an output that varies as a quasi-linear function of the logarithm of the mean of the square of the RF input signal voltage. In other words, the circuit 200 can provide an output that varies generally linearly in dB with MS voltage of the RF signal. As the logarithm of the square root of a number is simply half the logarithm of that number, this linear in dB output can also serve as a measure of the root mean square (RMS) of the RF signal using an output scaling factor of ½.

Figure 3:
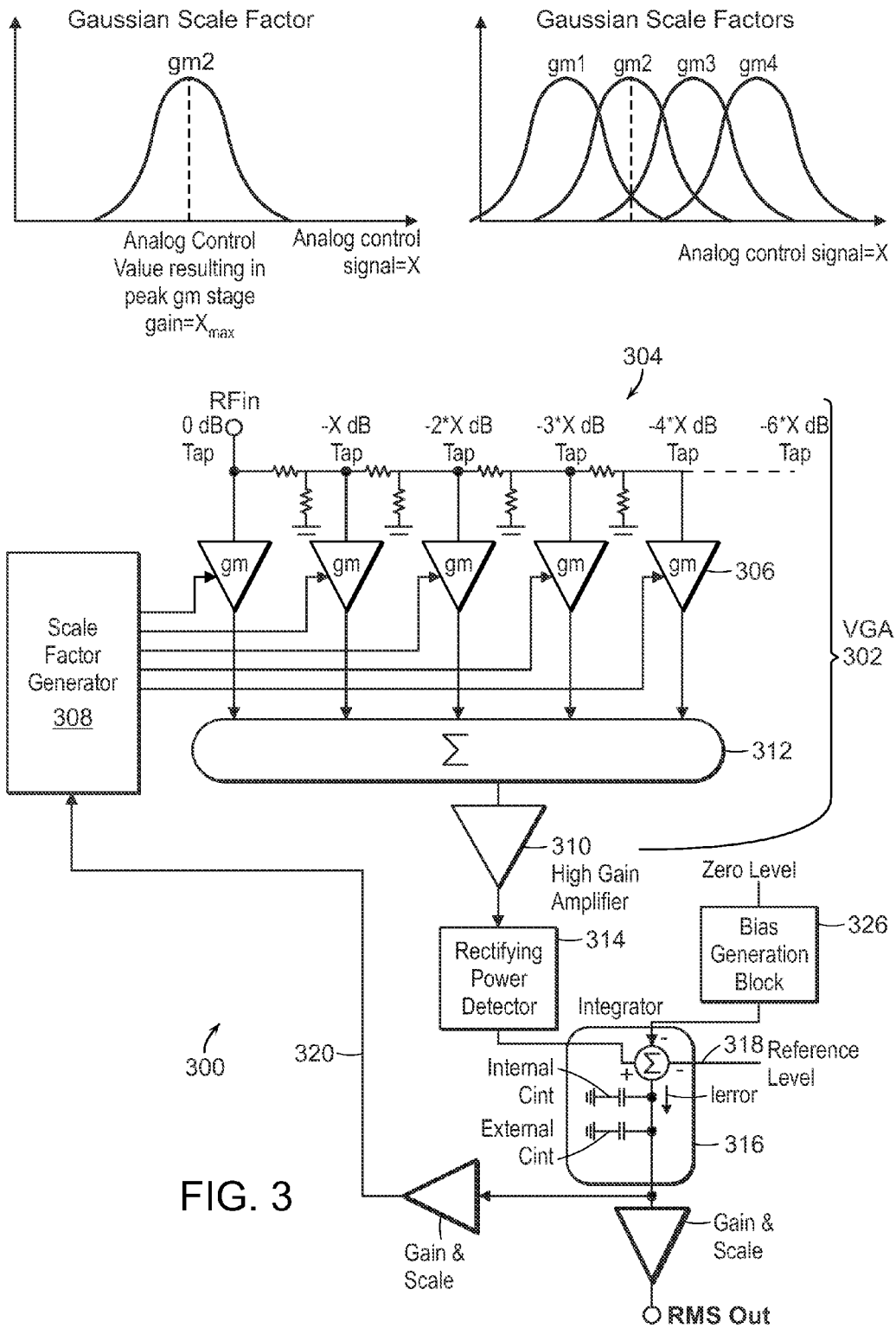
FIG. 3 is a block diagram illustrating a mean square power detector.

FIG. 3 is a block diagram illustrating a mean square power detector 300, which includes an exponentially controlled (linear-in-dB) VGA 302. The VGA 302 comprises a resistive ladder attenuator 304, transconductance elements 306 with variable scaling factors, a scale factor generator 308 for generating signals controlling the transconductance elements 306, and a fixed gain amplifier 310 receiving the summed outputs of the transconductance elements 306 from summer 312.

The control currents from the scale factor generator 308 that scale the outputs of the transconductance elements 306 are shown in the accompanying graphs as Gaussian shaped (bell-type) waveforms resulting in a smooth "turn-on" of the transconductance elements 306 to a maximum scale and a smooth "turn-off" after reaching this maximum. The scaling factors are controlled by a gain control signal that activates and deactivates the consecutive transconductance elements 306 in a progressive manner when swept in its usable range. As the transconductance elements 306 receiving more attenuated taps are selected (by increasing their scaling factor respective to others), the overall gain of the VGA 302 is lowered smoothly.

The outputs of all transconductance elements 306 are added (all output nodes are connected for summation in the current domain in this embodiment) by summer 312 representing the selected attenuation level. The resulting summed output is amplified by the fixed gain amplifier 310 to obtain the final amplification/attenuation range. For example, an 8 stage ladder attenuator with 6 dB taps result in an attenuation range of 0 dB to 48 dB. Use of a 50 dB fixed amplifier, e.g., would result in an overall gain range of 2 to 50 dB.

The output of VGA 302 drives a squaring power detector 314. The output of the squaring power detector 314 is fed to an integrator 316. The integrator 316 integrates the difference between detected signal received from the squaring power detector 314 and a reference signal 318 to provide a representation of the mean square or root mean square of the RF input signal. The output of the integrator 316 provides the scale control feedback signal sent to the scale factor generator unit 308, optionally via a gain and scale element, through a feedback loop 320. A bias generation element 326 provides an input to the integrator 316 for temperature compensation.

Figure 4:
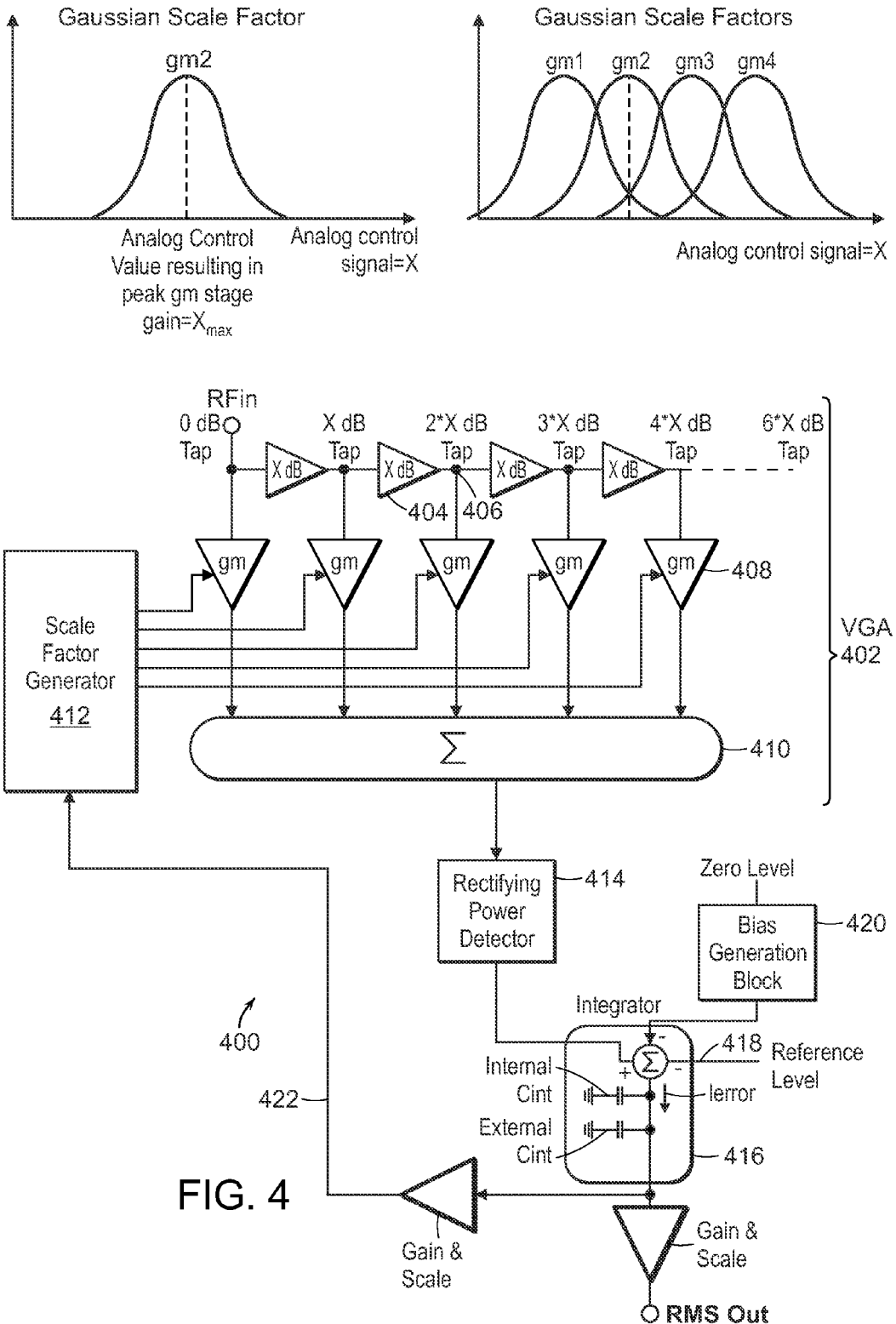
FIG. 4 is a block diagram illustrating a mean square power detector in accordance with one or more embodiments of the invention.

FIG. 4 is a block diagram illustrating a mean square detector 400 in accordance with one or more embodiments of the invention. The mean square detector 400 includes a VGA 402 that differs from the VGA 302 of the mean square detector 300 shown in FIG. 3 primarily in the manner in which the VGA's amplification/attenuation range is obtained. Instead of using a ladder attenuator, the VGA 402 utilizes a series chain of amplifiers 404 for generating progressively amplified representations of the input signal at a series of nodes or taps 406, which are separated from each other by a specific amount of amplification. If we assume that there are N gain stages of X dB, the total ratio in dB between the maximum amplification and input is NX dB. There are (N+1) gain taps, including the input signal node.

In the FIG. 4 embodiment, the amplifiers 404 are implemented differentially. However, it should be understood that single-ended implementation is also possible. Although not shown, the gain taps 406 can be buffered before driving the next amplifier 404 in the chain. The tap ratio separation X can be stabilized over temperature, supply, and process variations using suitable biasing techniques.

The taps 406 are coupled to the inputs of transconductance elements 408, which provide variable gain. A scale factor generator 412 has outputs coupled to each of the transconductance elements 408. The scale factor generator 412 generates signals for controlling and varying the gain of each of the transconductance elements 408 in response to a gain control signal from the integrator 416.

A summer 410 adds the outputs of each of the transconductance elements 408. Unlike the VGA 302 of FIG. 3, the VGA 402 does not include a fixed gain or high gain amplifier for obtaining the final amplification range because amplification is provided by the chain of amplifiers 404.

The control currents from the scale factor generator 412 that scale the outputs of the transconductance elements 408 are shown in the graphs accompanying FIG. 4 as Gaussian shaped (i.e., bell-type) waveforms. As the gain control signal from the integrator 416 is swept through its full range, the transconductance elements 408 are selectively and successively activated and deactivated by the control currents. The response of each of the transconductance elements 408 in succession is increased smoothly to a peak and thereafter decreased smoothly to a lower level corresponding to the magnitude of the respective control current. This results in a smooth turn-on of the transconductance elements 408 to a maximum gain and a smooth turn-off after reaching the maximum. As the transconductance elements 408 receiving more amplified taps are selected by increasing their scaling factor relative to other transconductance elements 408, the overall gain of the VGA 402 is increased smoothly. For example, an 8 stage amplifier chain with 6 dB taps results in an overall amplification range of 0 dB to 48 dB.

The output of VGA 402 drives a squaring power detector 414. The output of the squaring power detector 414 is fed to an integrator 416. The integrator 416 also receives a reference level signal 418 and the output of a bias generation block 420 for temperature compensation.

Using a servo feedback loop 422, the integrator 416 keeps the average of the squaring power detector output approximately equal to the sum of the reference level signal 418 and the output of the bias generation block 420 by varying the gain control signal, which changes the gain of the VGA 402. For example, if the sum of the bias generation block output and reference level signal is equivalent to an average output from the squaring power detector 414 when it receives a −10 dBm signal at its input, then for a −30 dBm system input signal, the VGA gain is set to 20 dB.

Figure 5:
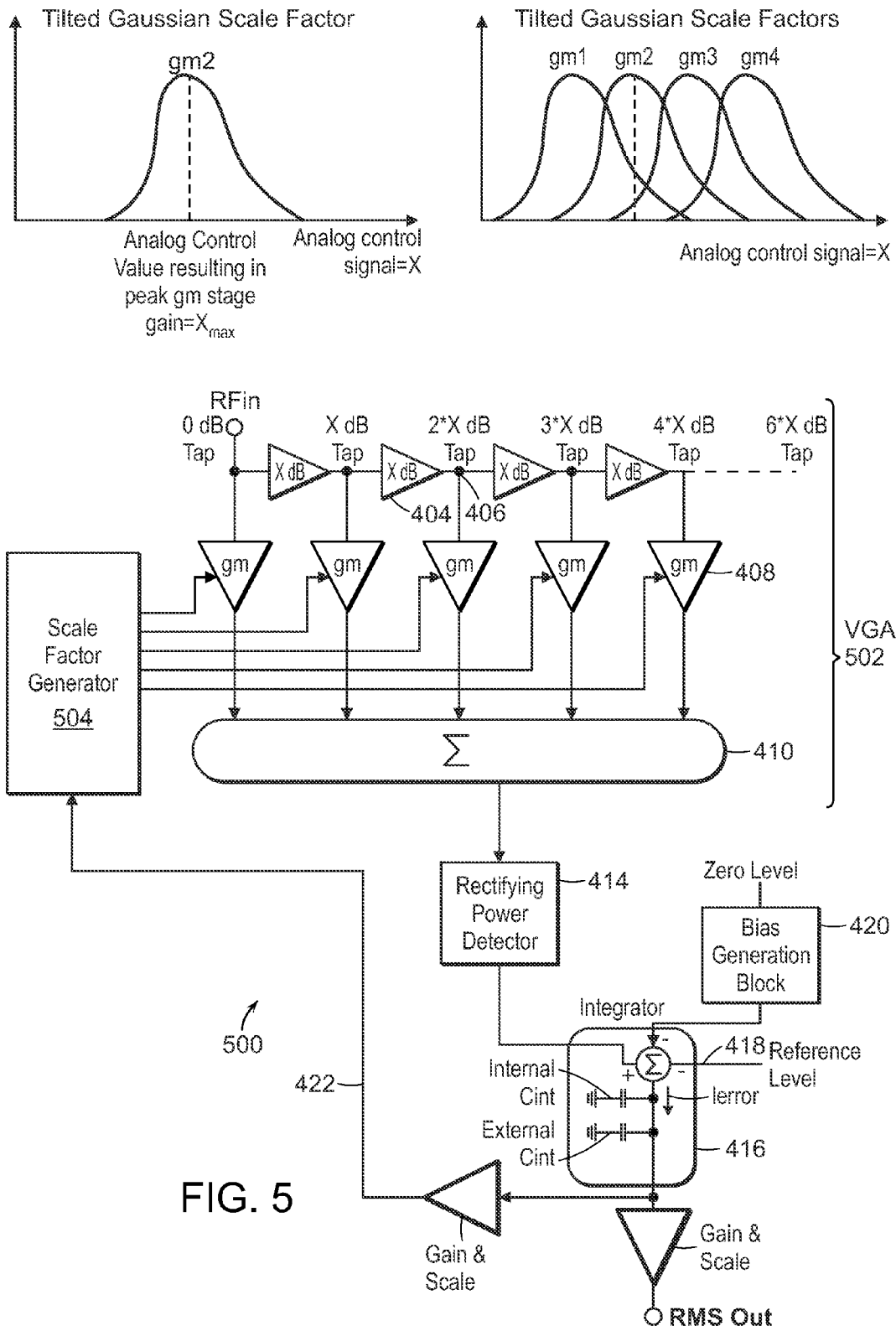
FIG. 5 is a block diagram illustrating a mean square power detector in accordance with one or more further embodiments of the invention.

FIG. 5 is a block diagram illustrating a mean square detector 500 in accordance with one or more embodiments of the invention. As discussed above, the mean square detector 400 of FIG. 4 includes a scale factor generator 412 that generates control currents (i.e., scale factor signals) for the transconductance elements 408 that scale their outputs with a transfer function similar to a Gaussian curve, resulting in a symmetrical and smooth turn-on and turn-off of the transconductance elements as the scale factor control signal is swept. When the servo feedback loop 422 in the FIG. 4 embodiment is locked, the output of the VGA 402 is dominated by a few transconductance elements 408 that have the highest scaling factors. The contributions of the transconductance elements 408 are determined by their respective input signal levels and the respective scale factors. Therefore, the symmetrical control currents from the scale factor generator 412 inherently result in greater contribution from the transconductance elements 408 receiving higher signal levels even if their scale factors are lower than transconductance elements 408 receiving lower signal levels. For operations with high-crest factor signals, the system input signal power can increase significantly momentarily (more than 10 dB), and that may result in saturation of the amplifiers 404 at the high end of the amplification chain, which provides the highest amplification levels. If the transconductance elements 408 receiving these saturated-amplification taps have significant contribution to the VGA output, the gain of the VGA 402 can have errors resulting in measurement inaccuracies for the mean square power detector system.

In the embodiment illustrated in FIG. 5, the VGA 502 includes a scale factor generator 504 that is configured to provide "tilted", nonsymmetrical Gaussian type scale factors to the transconductance elements 408. The use of non-symmetrical scale factors as illustrated in the graphs accompanying FIG. 5 causes contributions to the VGA output from the transconductance elements 408 receiving higher signal levels to be reduced, thereby increasing the contribution of the selected transconductance elements 408 receiving lower signal levels. This results in an improvement in the detection accuracy of high crest factor signals.

Similarly, the scale factor generator 308 of the power detector 300 of FIG. 3 can also be configured to provide tilted, nonsymmetrical Gaussian type scale factors to the transconductance elements 306.

Figure 6:
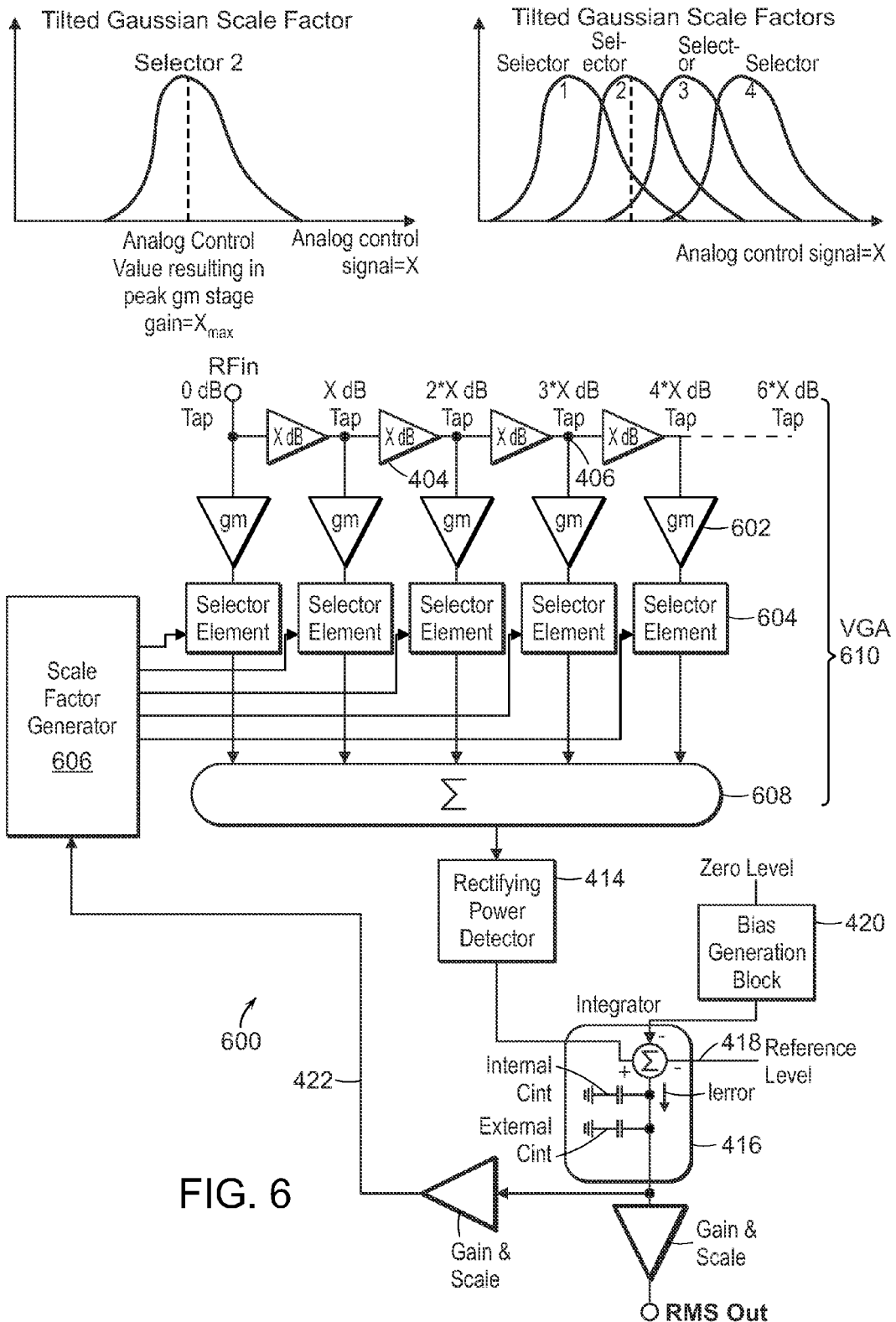
FIG. 6 is a block diagram illustrating a mean square power detector in accordance with one or more further embodiments of the invention.

FIG. 6 is a block diagram illustrating a mean square detector 600 in accordance with one or more further embodiments of the invention. In the mean square detector 600, the VGA 610 includes a plurality of the transconductance elements 602, each of which has a fixed scale factor. The VGA 610 also includes a plurality of selector elements 604, each having a first input coupled to the output of one of the transconductance elements 602 and a second input coupled to the output from the scale factor generator 606. The outputs of the selector elements 604 are combined by the summer 608.

Conventional transconductance elements include resistively degenerated differential pairs or multi-tan h doublets for improved linearity for input signals. Transconductance elements should operate linearly with a large range of signal levels, particularly for handling large crest factor signals. For example, the dominantly selected transconductance element may have an input signal level of −10 dBm when the servo loop is locked, and this element may be receiving 15 dB higher signal levels when the input signal level increases momentarily for a high crest factor modulated signal. However, when the operating current level of conventionally degenerated transconductance elements are scaled, their input linear range also changes, resulting in a significant reduction in the linear range for low operating current levels. The selector elements 604 of the FIG. 6 embodiment overcome this potential issue by allowing the transconductance elements to have generally constant linearity for different scaling factors. In particular, the scale factor generator 606 varies the response of each of the selector elements 604 so that as the gain control signal from the integrator is swept through its full range, the response of each of the selector element 604 is successively increased smoothly to a peak and thereafter decreased smoothly to a lower level.

Although the graphs accompanying FIG. 6 illustrate use of tilted Gaussian scale factors, it should be understood that a scale factor generator that generates symmetrical Gaussian scale factors as shown in FIG. 4 can also be used.

Figure 7:
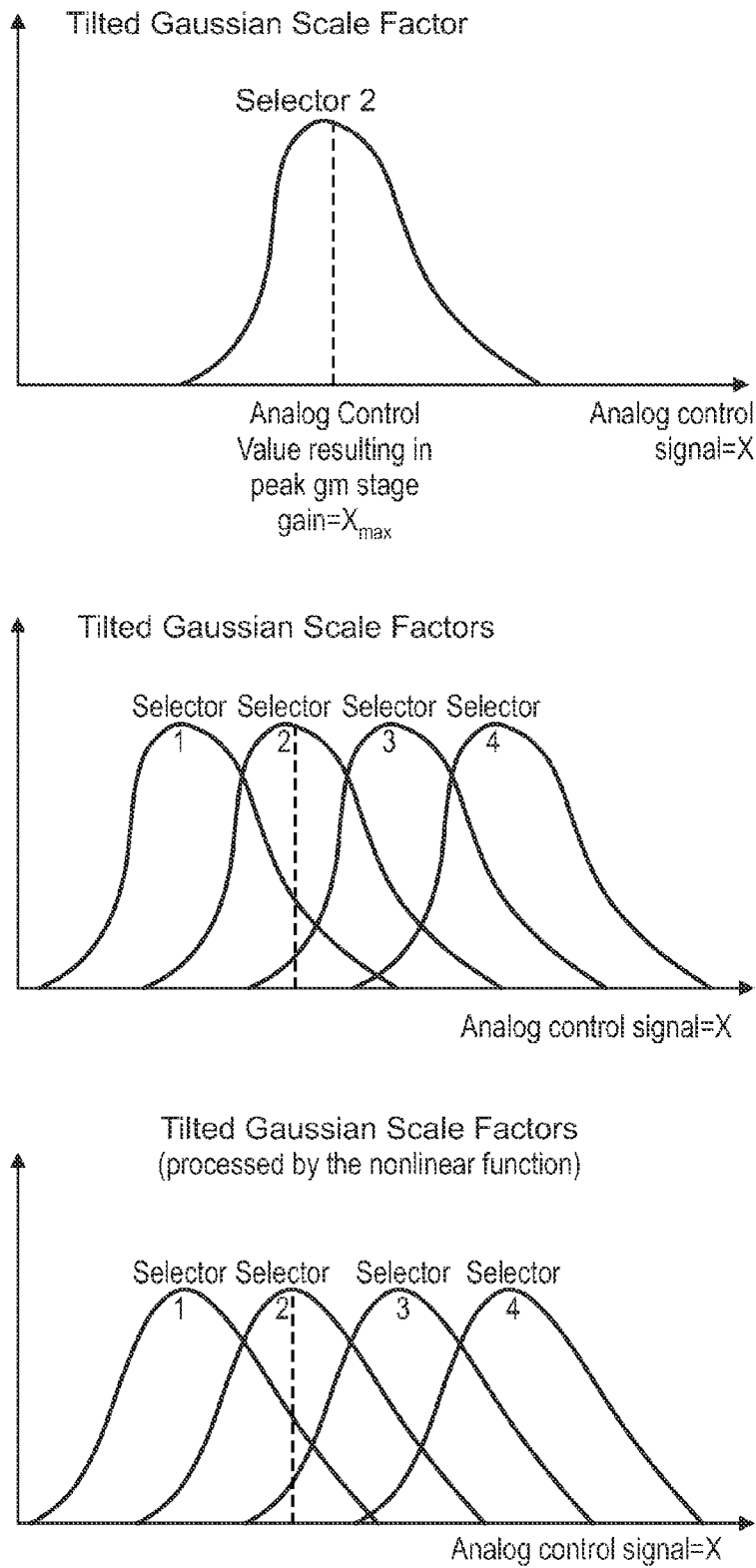
FIG. 7 is a block diagram illustrating a mean square power detector in accordance with one or more further embodiments of the invention.
Figure 7:
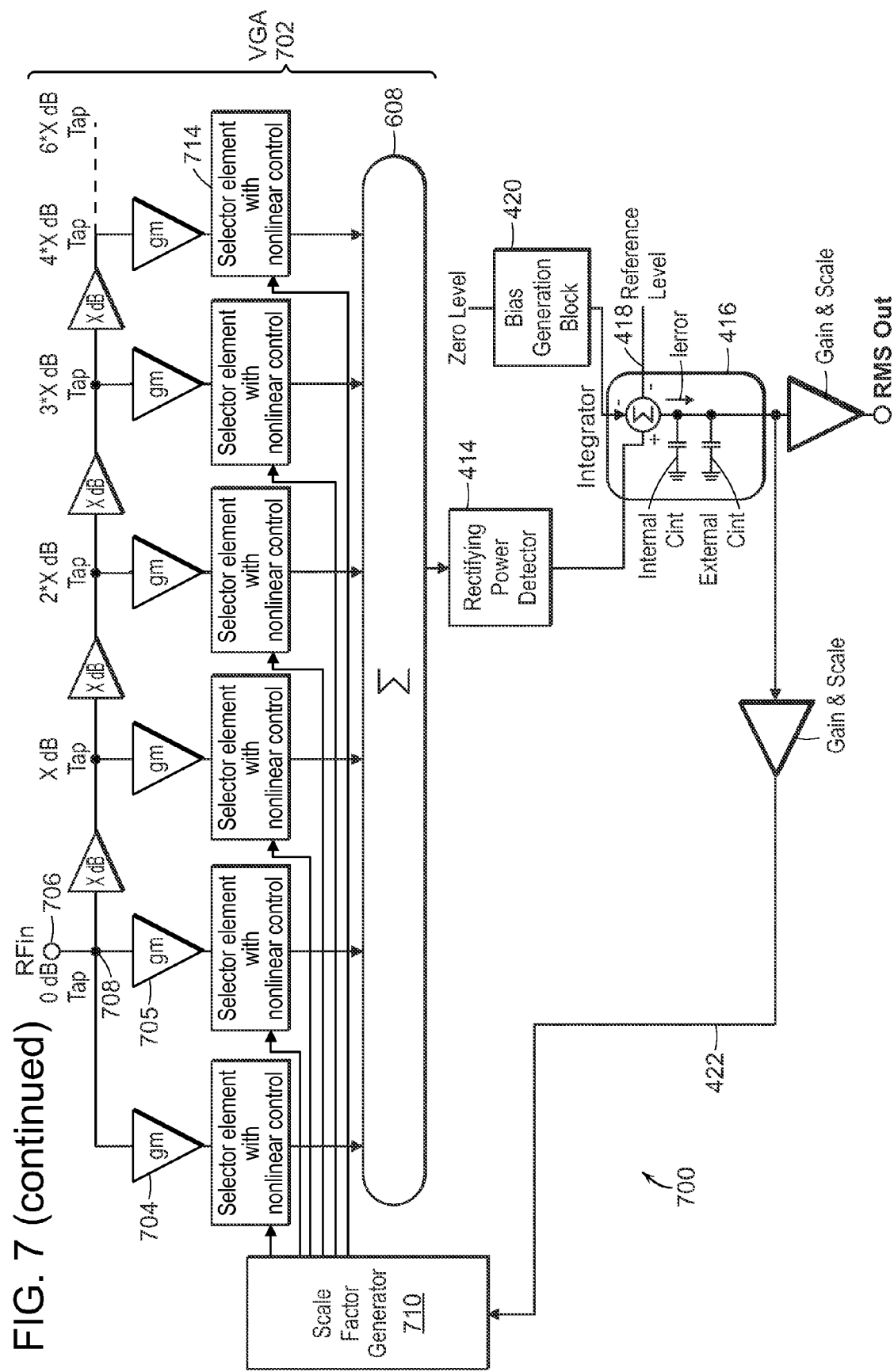

FIG. 7 is a block diagram illustrating a mean square detector 700 in accordance with one or more further embodiments of the invention. In the embodiments shown in FIGS. 4, 5, and 6, the use of the Gaussian or tilted Gaussian type scaling factor signals for the transconductance elements or selector elements can result in a periodic deviation or ripple in the transfer characteristics of the logarithmic mean square power detector when compared to an ideal linear-in-dB transfer function between the input signal level (in dBm) and output voltage/current level (V/A). The transfer function periodic deviation can be reduced by applying a nonlinear transformation on the scaling factors used for the transconductance elements or selector elements 714 to obtain better linear-in-dB transfer characteristics from the VGA (or from the detector system RF input power level (in dBm) to the mean square detector output V or A). The reduction in the transfer function periodic deviation can be achieved by providing a more linear turn-off (when gain control signal is swept) for the scale factor signals in the direction of the wider part of the tilted Gaussian scale factors as shown in the graphs accompanying FIG. 7. Since the gain control signal linearly maps to the input signal levels in dBm (with possible offsets for linear mapping), the system periodic deviation is reduced, resulting in a more linear transfer function from input signal level (dBm) to the mean square power detector output (V or A). This nonlinear transformation increases the contribution of the transconductance elements operating with lower signal levels (coupled to taps with lower amplification), and therefore do not adversely affect the crest-factor detection performance.

The mean square detector 700 of FIG. 7 can also include an additional 0 dB transconductance element 704 that is directly connected to the RF input node 706. (It should be understood however, that there may be elements (not shown) such as a buffer/amplifier between the RF input 706 and the transconductance nodes.) The additional transconductance element 704 has a lower transconductance gain and higher input linearity to improve the input detection range of the system. The additional transconductance element 704 handles higher signal levels than the other transconductance element 705 connected to the 0 dB tap 708 and, therefore, improves the measurement dynamic range of the system. For example, if this additional transconductance element 704 has half the transconductance and double the input linear range of other transconductance elements, the detection dynamic range is improved by 6 dB.

An additional transconductance element that has a lower transconductance gain and higher input linearity as shown in FIG. 7 can be provided in each of the embodiments described herein to improve the input detection range of the system.

Figure 8:
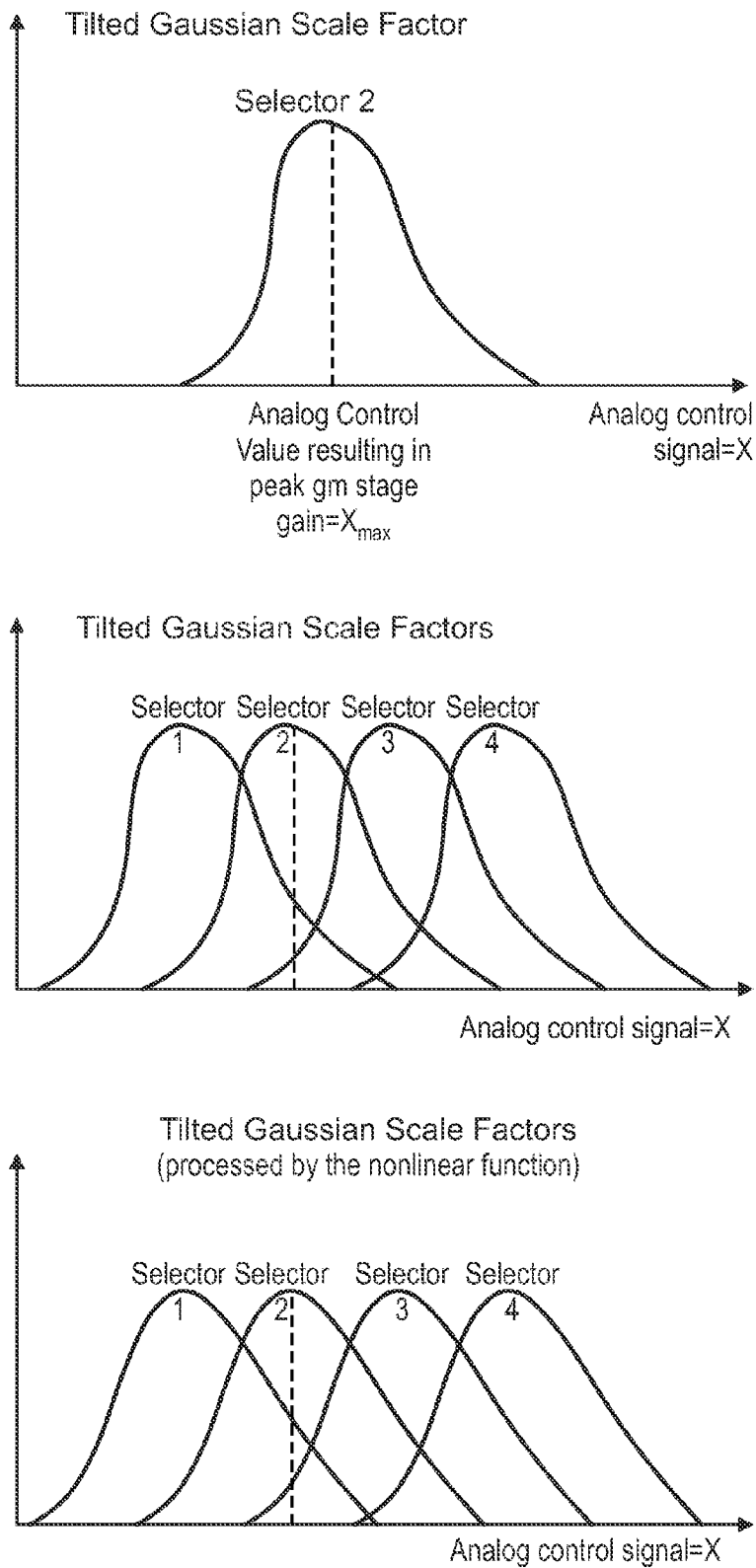
FIG. 8 is a block diagram illustrating a mean square power detector in accordance with one or more further embodiments of the invention.
Figure 8:
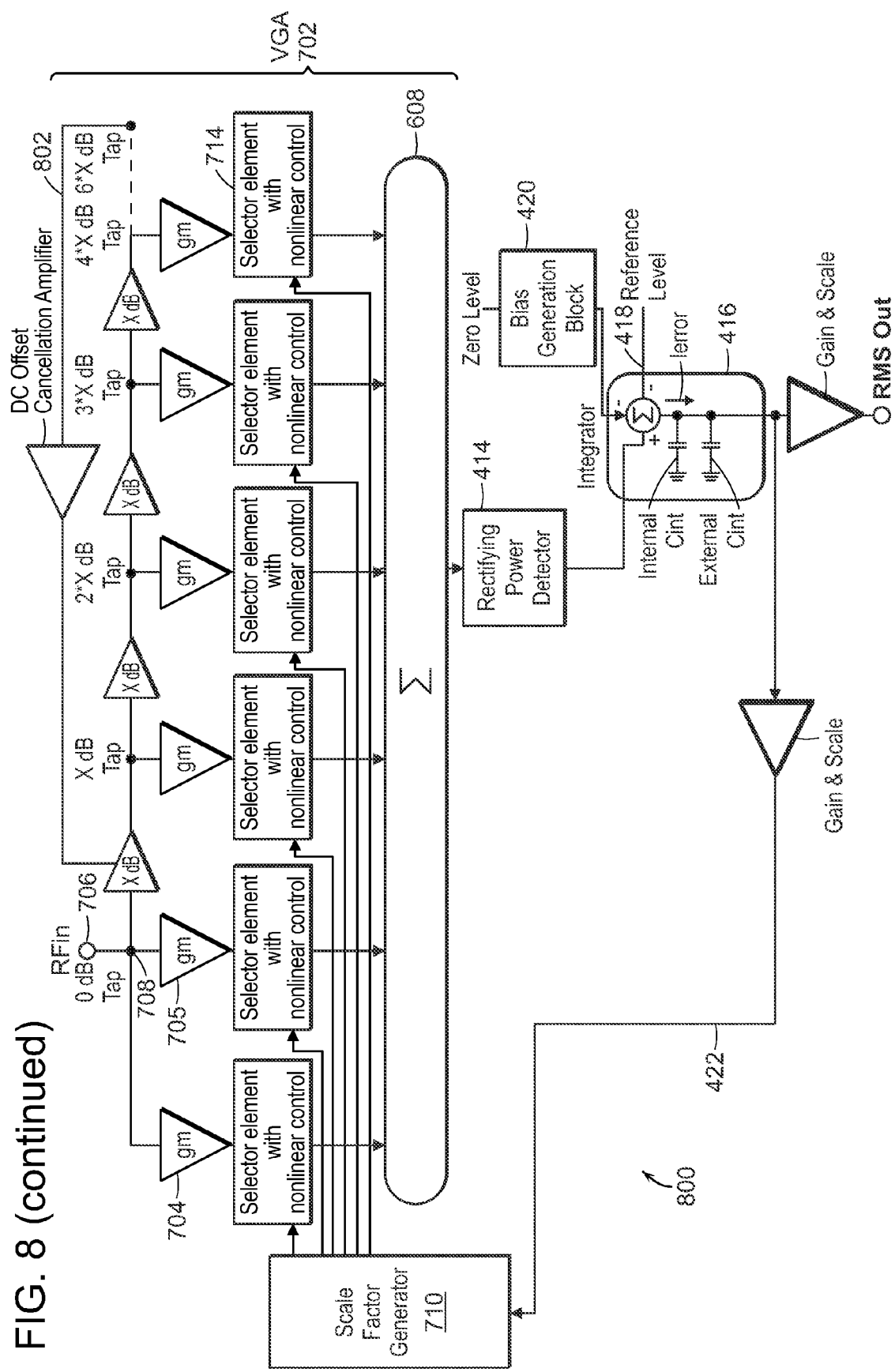

FIG. 8 is a block diagram illustrating a mean square detector 800 in accordance with one or more further embodiments of the invention. An improvement of the mean square detector 800 over the mean square detector 700 of FIG. 7 is the inclusion of a DC offset cancellation feedback loop 802 around the amplifier chain. The DC offset cancellation feedback loop 802 virtually eliminates the detector sensitivity degradation from DC offsets inherent to practical implementations of amplifiers 404. In VGAs such as VGA 302 in FIG. 3, most offset error can originate in the transconductance elements 306, thus this offset varies with the scaling factor control. This can cause measurement errors under dynamic signal conditions, whereas the offset error in VGA 402 is almost constant with scaling factor control, leading to improved accuracy of the system. The corner frequency of the DC cancellation loop may be adjustable through a user-selectable capacitor (not shown in FIG. 8). It should be understood that although the signal lines are shown in the figure to be single-ended, the system can also be implemented fully differentially. This offset cancellation loop can be included in each of the FIG. 4 through FIG. 8 VGA embodiments described herein.

Figure 9:
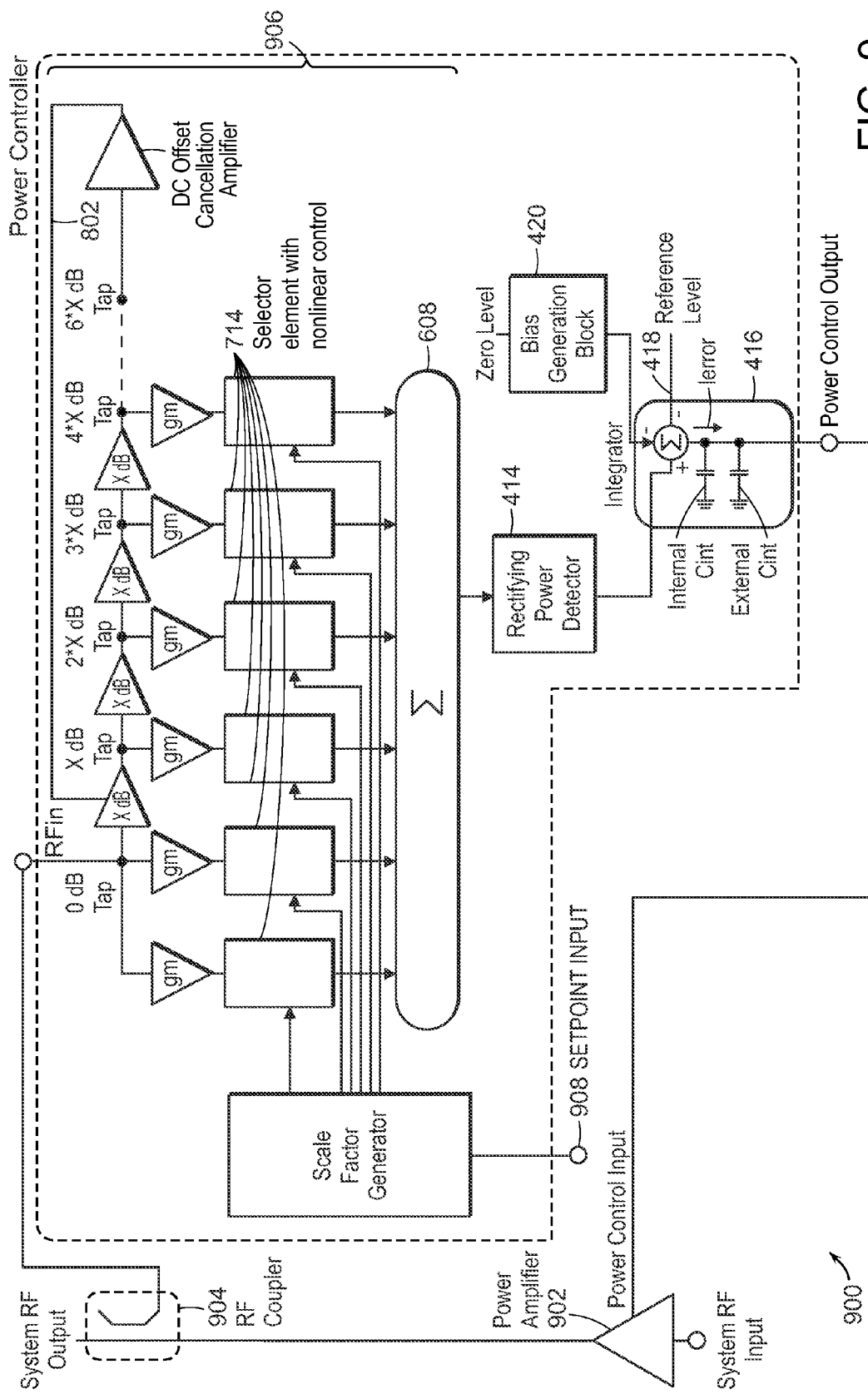
FIG. 9 is a block diagram illustrating a mean square power detector in accordance with one or more further embodiments of the invention.

FIG. 9 is a block diagram illustrating a mean square detector 900 in accordance with one or more further embodiments of the invention. In this embodiment, the feedback between the output of the integrator 416 and the gain-control input of the VGA (scale-control) is disconnected for a controller mode operation. In one example of the controller mode operation, the output power of an RF power amplifier (PA) 902 (or any other voltage-controlled gain amplifier in which the power—amplitude—of its AC output signal varies responsive to the DC level of its control signal) can be accurately regulated by the use of the controller. The output of the PA 902 is sampled by RF coupler (power sampler) 904 with the sampled signal being proportional to the power (amplitude) of the output of the PA 902. The sampled signal is initially processed by the VGA 906, which takes the sampled signal and provides a gain to the power (amplitude) of this signal according to a user supplied control signal at its SETPOINT input 908. In this application, the SETPOINT input 908 represents the desired power output of the PA 902. The output of the VGA 906 drives a squaring power detector 414 calculating the mean square of the sampled and amplified signal in combination with an integrator 416. An error amplifier compares the mean squared signal with a reference signal level. Furthermore, the "Power Control Output" of the controller (i.e., the output of the integrator 416) is coupled (via optional scaling elements, offset elements etc.) to the "Power Control Input" of the PA 902. Therefore, the RF coupler 904 (power sampling circuit), the VGA 906, the detector/integrator (mean square calculator) 414, 416, the error amplifier, and the PA 902 form a feedback control loop of system RF input.

For proper operation of the controller, the setpoint input voltage should be selected in a proper range (the output range of the detector configuration assuming that all gain/scale blocks are same with the detector configuration); this fixes the gain of the VGA 906. Depending on the initial PA output power (also coupler gain and VGA gain for selected setpoint) if the mean squared output of the VGA 906 is lower than the reference level, the feedback loop should increase the gain of the PA 902 (or output power of the PA) such that the mean squared output of the VGA 906 shifts closer to the reference level. Reverse action occurs if the mean squared output of the VGA 906 is higher than the reference level. The feedback system is locked whenever the mean squared output of the VGA 906 is equal (or very close depending on the feedback gain) to the reference level.

In each of the embodiments described herein, a nonlinear transformation can also be applied to the scaling factors supplied to transconductance elements with variable scaling factors or to selector elements in order to obtain improved linear-in-dB transfer characteristics from the VGA or from the detector system RF input power level (in dBm) to the mean square detector output.

In the various embodiments described herein, transconductance elements are used for converting voltage levels to current levels to be combined by a summer. It should be understood, however, that the functionality of the mean square detectors described herein can also be achieved using voltage signals that are not converted to current levels in the variable gain amplifier.

In the various illustrated embodiments, a series chain of amplifiers is used for generating progressively amplified representations of the input signal. Alternatively, in each of the embodiments, the series chain of amplifiers can instead be arranged in parallel to generate the multiple taps in a non-progressive manner.

Also, in various embodiments, the amplifiers in the chain of amplifiers are described as being implemented differentially. However, it should be understood that single-ended implementation is also possible.

The variable gain amplifiers of various embodiments described herein can be exponentially controlled or controlled by other nonlinear or linear control elements.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

What is claimed is:

1. A variable gain amplifier, comprising:
a plurality of amplification elements arranged to generate amplified representations of an RF input signal at a plurality of nodes;
a plurality of controllable response elements each having an input coupled to a different one of the plurality of nodes to receive a different one of the amplified representations of the RF input signal;
a scale factor generator coupled to each of the controllable response elements, the scale factor generator receiving a gain control signal and generating scale factor signals for varying the response of each of the controllable response elements such that as the scale factor generator sweeps through a full range of the gain control signal, the response of each of the controllable response elements is, in succession, increased smoothly to a peak and thereafter decreased smoothly to a lower level to produce a scaled output; and
a summing element coupled to the plurality of controllable response elements for combining the scaled outputs of the plurality of controllable response elements to generate an output of the variable gain amplifier having a given gain range.

2. The variable gain amplifier of claim 1 wherein the plurality of amplification elements are arranged in a series configuration to generate progressively amplified representations of the RF input signal.

3. The variable gain amplifier of claim 1 wherein the plurality of amplification elements are arranged in a parallel configuration with each amplification element generating a different amplified representation of the RF input signal.

4. The variable gain amplifier of claim 1 wherein the controllable response elements comprise transconductance elements.

5. The variable gain amplifier of claim 1 wherein the controllable response elements comprise voltage attenuator or amplifier elements.

6. The variable gain amplifier of claim 1 wherein the scale factor signals generated by the scale factor generator comprise control currents steered to each of the controllable response elements successively as the gain control signal is swept through its full range.

7. The variable gain amplifier of claim 6 wherein the response of each of the controllable response elements is increased or decreased by a change in the magnitude of the control current directed to a controllable response element through the control range for that controllable response element.

8. The variable gain amplifier of claim 1 wherein the scale factor signals are non-symmetrical such that the response of controllable response elements connected to lower gain nodes is greater than the response of controllable response elements connected to higher gain nodes.

9. The variable gain amplifier of claim 1 further comprising an additional controllable response element coupled to receive the RF input signal having a lower transconductance gain and higher input linearity to improve input detection range.

10. The variable gain amplifier of claim 1 wherein the variable gain amplifier is implemented in a mean square power detector comprising the variable gain amplifier, a squaring power detector for producing a detected signal from the output of the variable gain amplifier, and an integrator for integrating the difference between the detected signal received from the squaring power detector and a reference signal to provide a representation of the mean square or root mean square of the RF input signal.

11. The variable gain amplifier of claim 1 wherein a squaring power detector produces a detected signal from the output of the variable gain amplifier, and an integrator integrates the difference between the detected signal received from the squaring power detector and a reference signal to provide a representation of the mean square or root mean square of the RF input signal, and wherein the gain control signal of the variable gain amplifier comprises the representation of the mean square or root mean square of the RF input signal.

12. The variable gain amplifier of claim 1 further comprising a DC offset cancellation feedback loop coupled around the plurality of amplification elements to reduce uncertainties due to DC offsets and improve system balance.

13. The variable gain amplifier for claim 1 wherein a non-linear transformation is applied to the scale factor signals provided to the controllable response elements to obtain improved linear-in-dB transfer characteristics.

14. A variable gain amplifier, comprising:
a plurality of amplification elements arranged to generate amplified representations of an RF input signal at a plurality of nodes;
a plurality of transconductance elements each having an input coupled to a different one of the plurality of nodes to receive a different one of the amplified representations of the RF input signal, said transconductance elements converting voltage levels of the amplified representations of the RF input signal to current levels;
a plurality of controllable selector elements each having an input coupled to an output of a different one of the plurality of transconductance elements to receive the current levels of the amplified representations of the RF input signal;
a scale factor generator coupled to each of the controllable selector elements, the scale factor generator receiving a gain control signal and generating scale factor signals for varying the response of each of the controllable selector elements such that as the scale factor generator sweeps through a full range of the gain control signal, the response of each of the controllable selector elements is, in succession, increased smoothly to a peak and thereafter decreased smoothly to a lower level to produce a scaled output; and
a summing element coupled to the plurality of controllable selector elements for combining the scaled outputs of the plurality of controllable selector elements to generate an output of the variable gain amplifier having a given gain range.

15. The variable gain amplifier of claim 14 wherein the plurality of amplification elements are arranged in a series configuration to generate progressively amplified representations of the RF input signal.

16. The variable gain amplifier of claim 14 wherein the plurality of amplification elements are arranged in a parallel configuration with each amplification element generating a different amplified representation of the RF input signal.

17. The variable gain amplifier of claim 14 wherein each of the plurality of transconductance elements has a fixed scale factor.

18. The variable gain amplifier of claim 14 further comprising an additional transconductance element coupled to receive the RF input signal, the additional transconductance element having a lower transconductance gain and higher input linearity to improve input detection range.

19. The variable gain amplifier of claim 14 further comprising an additional controllable selector element coupled to receive the RF input signal, the additional controllable selector element having a lower selection gain to improve input detection range.

20. The variable gain amplifier for claim 14 wherein a non-linear transformation is applied to the scale factor signals provided to the controllable selector elements to obtain improved linear-in-dB transfer characteristics.

21. The variable gain amplifier of claim 14 wherein the scale factor signals are non-symmetrical such that the response of controllable selector elements coupled to lower amplification nodes is greater than the response of controllable selector elements connected to higher amplification nodes.

22. The variable gain amplifier of claim 14 wherein the variable gain amplifier is implemented in a mean square power detector comprising the variable gain amplifier, a squaring power detector for producing a detected signal from the output of the variable gain amplifier, and an integrator for integrating the difference between the detected signal received from the squaring power detector and a reference signal to provide a representation of the mean square or root mean square of the RF input signal.

23. The variable gain amplifier of claim 14 wherein a squaring power detector produces a detected signal from the output of the variable gain amplifier, and an integrator integrates the difference between the detected signal received from the squaring power detector and a reference signal to provide a representation of a mean square or root mean square of the RF input signal, and wherein the gain control signal comprises the representation of the mean square or root mean square of the RF input signal.

24. The variable gain amplifier of claim 14 further comprising a DC offset cancellation feedback loop coupled around the plurality of amplification elements to reduce uncertainties due to DC offsets and improve system balance.

25. A method of amplifying an RF input signal, comprising the steps of:
(a) generating a plurality of amplified representations of the RF input signal;
(b) variably scaling each of said plurality of amplified representations of the RF input signal based on a gain control signal by, in succession, increasing each of said plurality of amplified representations of the RF input signal smoothly to a peak and thereafter decreasing it smoothly to a lower level to produce a scaled output while sweeping through a full range of the gain control signal; and
(c) combining the scaled outputs to generate an output having a given gain range.

26. The method of claim 25 wherein the step (a) comprises generating a plurality of progressively amplified representations of the RF input signal.

27. The method of claim 25 wherein increasing each of said plurality of amplified representations of the RF input signal smoothly to a peak and thereafter decreasing it smoothly to a lower level is performed non-symmetrically such that lower amplified representations of the RF input signal contribute more to the output produced in (c) than higher amplified representations of the RF input signal.

28. The method of claim 25 further comprising producing a detected signal from the output produced in (c) using a squaring detector, and integrating the difference between the detected signal and a reference signal to provide a representation of the mean square or root mean square of the RF input signal.

29. The method of claim 25 further comprising producing a detected signal from the output produced in (c) using a squaring detector and integrating the difference between the detected signal and a reference signal to provide a representation of the mean square or root mean square of the RF input signal to be used as the gain control signal.

30. The method of claim 25 further comprising using a DC offset cancellation feedback loop to reduce uncertainties due to DC offsets and improve system balance.

31. The method of claim 25 further comprising applying a non-linear transformation to scale factor signals used for variably amplifying each of said plurality of amplified representations to obtain improved linear-in-dB transfer characteristics.

32. A method of amplifying an RF input signal, comprising the steps of:
  (a) generating a plurality of amplified representations of the RF input signal;
  (b) converting voltage levels of the amplified representations of the RF input signal to current levels;
  (c) variably scaling the current level of each of the plurality of amplified representations of the RF input signal based on a gain control signal by, in succession, increasing the current level smoothly to a peak and thereafter decreasing it smoothly to a lower level to produce a scaled output while sweeping through a full range of the gain control signal; and
  (d) combining the scaled outputs to generate an output having a given gain range.

33. The method of claim 32 wherein the step (a) comprises generating a plurality of progressively amplified representations of the RF input signal.

34. The method of claim 32 further comprising producing a detected signal from the output produced in (d), and integrating the difference between the detected signal and a reference signal to provide a representation of the mean square or root mean square of the RF input signal.

35. The method of claim 32 further comprising producing a detected signal from the output produced in (d) using a squaring detector, and integrating the difference between the detected signal and a reference signal to provide a representation of the mean square or root mean square of the RF input signal to be used as the gain control signal.

36. The method of claim 32 wherein increasing the current level of each of said plurality of amplified representations of the RF input signal smoothly to a peak and thereafter decreasing it smoothly to a lower level is performed non-symmetrically such that lower amplified representations of the RF input signal contribute more to the output produced in (d) than higher amplified representations of the RF input.

37. The method of claim 32 further comprising applying a non-linear transformation to scale factor signals used for variably amplifying each of said plurality of amplified representations to obtain improved linear-in-dB transfer characteristics.

38. A mean square power detector, comprising:
  (a) a variable gain amplifier, comprising:
    a plurality of amplification elements arranged to generate amplified representations of an RF input signal at a plurality of nodes;
    a plurality of controllable response elements each having an input coupled to a different one of the plurality of nodes to receive a different one of the amplified representations of the RF input signal;
    a scale factor generator coupled to each of the controllable response elements, the scale factor generator receiving a gain control signal and generating scale factor signals for varying the response of each of the controllable response elements such that as the scale factor generator sweeps through a full range of the gain control signal, the response of each of the controllable response elements is, in succession, increased smoothly to a peak and thereafter decreased smoothly to a lower level to produce a scaled output; and
    a summing element coupled to the plurality of controllable response elements for combining the scaled outputs of the plurality of controllable response elements to generate an output of the variable gain amplifier having a given gain range;
  (b) a squaring power detector coupled to the variable gain amplifier for producing a detected signal from the output of the variable gain amplifier; and
  (c) an integrator coupled to the squaring power detector for integrating the difference between the detected signal received from the squaring power detector and a reference signal to provide an output representative of the mean square or root mean square of the RF input signal.

39. The mean square power detector of claim 38 wherein the plurality of amplification elements of the variable gain amplifier are arranged in a series configuration.

40. The mean square power detector of claim 38 wherein the plurality of amplification elements of the variable gain amplifier are arranged in a parallel configuration.

41. The mean square power detector of claim 38 wherein the controllable response elements of the variable gain amplifier comprise transconductance elements.

42. The mean square power detector of claim 38 wherein the scale factor signals generated by the scale factor generator of the variable gain amplifier comprise control currents steered to each of the controllable response elements successively as the gain control signal is swept through its full range.

43. The mean square power detector of claim 42 wherein the response of each of the controllable response elements of the variable gain amplifier is increased or decreased by a change in the magnitude of the control current directed to a controllable response element through the control range for that controllable response element.

44. The mean square power detector of claim 38 wherein the scale factor signals are non-symmetrical such that the response of controllable response elements connected to lower gain nodes is greater than the response of controllable response elements connected to higher gain nodes.

45. The mean square power detector of claim 38 further comprising an additional controllable response element coupled to receive the RF input signal, the additional controllable response element having a lower transconductance gain and higher input linearity to improve input detection range.

46. The mean square power detector of claim 38 further comprising a feedback control loop that couples the output representative of the mean square or root mean square of the RF input signal to the scale factor generator to use as the gain control signal.

47. The mean square power detector of claim 38 further comprising a feedback control loop comprising a power amplifier for receiving the output of the integrator and a system RF input, and an RF coupler coupled to the power amplifier for sampling the output of the power amplifier, wherein the output of the RF coupler comprises the RF input signal, and wherein the gain control signal comprises a setpoint signal.

48. The mean square power detector of claim 38 further comprising a DC offset cancellation feedback loop coupled around the plurality of amplification elements to reduce uncertainties due to DC offsets and improve system balance.

49. The mean square power detector for claim 38 wherein a non-linear transformation is applied to the scale factor signals provided to the controllable response elements to obtain improved linear-in-dB transfer characteristics.

50. A mean square power detector, comprising:
(a) a variable gain amplifier, comprising:
  a plurality of amplification elements arranged to generate amplified representations of an RF input signal at a plurality of nodes;
  a plurality of transconductance elements each having an input coupled to a different one of the plurality of nodes to receive a different one of the amplified representations of the RF input signal, said transconductance elements converting voltage levels of the amplified representations of the RF input signal to current levels;
  a plurality of controllable selector elements each having an input coupled to an output of a different one of the plurality of transconductance elements to receive the current levels of the amplified representations of the RF input signal;
  a scale factor generator coupled to each of the controllable selector elements, the scale factor generator receiving a gain control signal and generating scale factor signals for varying the response of each of the controllable selector elements such that as the scale factor generator sweeps through a full range of the gain control signal, the response of each of the controllable selector elements is, in succession, increased smoothly to a peak and thereafter decreased smoothly to a lower level to produce a scaled output; and
  a summing element coupled to the plurality of controllable selector elements for combining the scaled outputs of the plurality of controllable selector elements to generate an output of the variable gain amplifier having a given gain range;
(b) a squaring power detector for producing a detected signal from the output of the variable gain amplifier; and
(c) an integrator for integrating the difference between the detected signal received from the squaring power detector and a reference signal to provide an output representative of the mean square or root mean square of the RF input signal.

51. The mean square power detector of claim 50 wherein the plurality of amplification elements of the variable gain amplifier are arranged in a series configuration.

52. The mean square power detector of claim 50 wherein the plurality of amplification elements of the variable gain amplifier are arranged in a parallel configuration.

53. The mean square power detector of claim 50 wherein each of the plurality of transconductance elements of the variable gain amplifier has a fixed scale factor.

54. The mean square power detector of claim 50 further comprising an additional transconductance element coupled to receive the RF input signal, the additional transconductance element having a lower transconductance gain and higher input linearity to improve input detection range.

55. The mean square power detector of claim 54 further comprising an additional controllable selector element coupled to receive the output of a transconductance element receiving the RF input signal, the additional controllable selector element having a lower selection gain to improve input detection range.

56. The mean square power detector of claim 50 wherein a non-linear transformation is applied to the scale factor signals provided to the controllable selector elements to obtain improved linear-in-dB transfer characteristics.

57. The mean square power detector of claim 50 further comprising a feedback control loop coupled to provide the output representative of the mean square or root mean square of the RF input signal to the scale factor generator to use as the gain control signal.

58. The mean square power detector of claim 50 further comprising a feedback control loop comprising a power amplifier for receiving the output of the integrator and a system RF input, and an RF coupler coupled to the power amplifier for sampling the output of the power amplifier, wherein the output of the RF coupler is provided to the plurality of amplification elements, and wherein the gain control signal comprises a setpoint signal.

59. The mean square power detector of claim 50 further comprising a DC offset cancellation feedback loop coupled around the plurality of amplification elements to reduce uncertainties due to DC offsets and improve system balance.

* * * * *

UNITED STATES PATENT AND TRADEMARK OFFICE
CERTIFICATE OF CORRECTION

PATENT NO. : 8,461,923 B2
APPLICATION NO. : 12/951697
DATED : June 11, 2013
INVENTOR(S) : Yalcin A. Eken et al.

Page 1 of 1

It is certified that error appears in the above-identified patent and that said Letters Patent is hereby corrected as shown below:

Title Page: Item (73) Assignee: "Hittite Microwave Norway AS, Tiller (NO)" should be changed to --Hittite Microwave Corporation, Chelmsford, MA (US)--.

Signed and Sealed this
Fifth Day of August, 2014

Michelle K. Lee
*Deputy Director of the United States Patent and Trademark Office*